(12) United States Patent
Johansson et al.

(10) Patent No.: US 8,409,732 B2
(45) Date of Patent: Apr. 2, 2013

(54) OXIDE COATED CUTTING INSERT

(75) Inventors: Mats Johansson, Linkoping (SE); Tommy Larsson, Angelsberg (SE)

(73) Assignee: Seco Tools AB, Fagersta (SE)

( * ) Notice: Subject to any disclaimer, the term of this patent is extended or adjusted under 35 U.S.C. 154(b) by 261 days.

(21) Appl. No.: 12/921,215

(22) PCT Filed: Mar. 3, 2009

(86) PCT No.: PCT/SE2009/000120
§ 371 (c)(1),
(2), (4) Date: Nov. 3, 2010

(87) PCT Pub. No.: WO2009/110831

PCT Pub. Date: Sep. 11, 2009

(65) Prior Publication Data
US 2011/0044775 A1    Feb. 24, 2011

(30) Foreign Application Priority Data
Mar. 7, 2008    (SE) .................................. 0800539

(51) Int. Cl.
*B32B 9/00* (2006.01)

(52) U.S. Cl. ....... 428/697; 51/307; 51/309; 204/192.15; 204/192.16; 428/216; 428/336; 428/698; 428/699; 428/701; 428/702

(58) Field of Classification Search ............ 51/307, 51/309; 428/216, 336, 697, 698, 699, 701, 428/702; 204/192.15, 192.16
See application file for complete search history.

(56) References Cited

U.S. PATENT DOCUMENTS

| 5,310,607 A | 5/1994 | Schulz et al. |
| 5,447,804 A | 9/1995 | Schulz et al. |
| 5,693,417 A | 12/1997 | Goedicke et al. |
| 6,767,627 B2 * | 7/2004 | Morikawa et al. ............ 428/336 |

(Continued)

FOREIGN PATENT DOCUMENTS

| EP | 0 603 144 A1 | 6/1994 |
| EP | 0 659 903 A1 | 6/1995 |

(Continued)

OTHER PUBLICATIONS

Ramm et al "Thermal Stability of Thin Corundum-type Solid Soultions of (Al(1−x)Cr(x))2O3 Synthesized under Low Temperature Non-Equilibrium Conditions" Advanced Eng Mat 2007 9, vol. 7 p. 604-608.*

(Continued)

*Primary Examiner* — Archene Turner
(74) *Attorney, Agent, or Firm* — Young & Thompson

(57) ABSTRACT

A cutting tool insert includes a body of a hard alloy of cemented carbide, cermet, ceramics, cubic boron nitride based material or high speed steel and a hard and wear resistant coating, including one or several layers, at least one of which is an $(Al,Cr)_2O_3$ layer. The coating, with a total thickness of 2-20 μm includes one or several layers, at least one of which is an $(Al,Cr)_2O_3$ layer with a thickness of 1-5 μm having a corundum phase crystalline structure and a composition $(Al_{1-y}Cr_y)_2O_3$ with $0.5 \leq y \leq 0.7$. The $(Al,Cr)_2O_3$ layer has a fiber texture with rotational symmetry in the direction of the coated surface normal with an inclination angle, φ, of the basal planes relative to the coated surface normal or the inclination angle, φ, for the highest peak in the pole plot with $20° < φ < 55°$.

14 Claims, 3 Drawing Sheets

A

B

U.S. PATENT DOCUMENTS

| | | | |
|---|---|---|---|
| 7,989,060 B2 * | 8/2011 | Larsson et al. | 428/336 |
| 8,025,989 B2 * | 9/2011 | Larsson | 428/697 |
| 2004/0121147 A1 | 6/2004 | Morikawa et al. | |
| 2004/0202877 A1 | 10/2004 | Martensson | |
| 2007/0104945 A1 | 5/2007 | Ruppi | |
| 2008/0090099 A1 | 4/2008 | Ramm et al. | |

FOREIGN PATENT DOCUMENTS

| | | | |
|---|---|---|---|
| EP | 0 744 473 A1 | | 11/1996 |
| EP | 0 738 336 B1 | | 4/1999 |
| EP | 1 477 581 A1 | | 11/2004 |
| EP | 1 479 791 A2 | | 11/2004 |
| EP | 1 528 125 A2 | | 5/2005 |
| EP | 1 655 387 A1 | | 5/2006 |
| EP | 1 655 388 A2 | | 5/2006 |
| EP | 1 655 392 A1 | | 5/2006 |
| JP | 06-322517 | * | 11/1994 |
| JP | 2002-053946 | * | 2/2002 |
| WO | 2006/099754 A1 | | 9/2006 |

OTHER PUBLICATIONS

Ramm et al "Pulse enhanced electron emission (P3etm) arc evpaporation and the synthesis of wear resistnat Al-Cr-O coatings in corundum structure" Surface & Coatings Tech 202 (2007) p. 876-833.*

Witthaut et al "Preparation of $Cr_2O_3$-$Al_2O_3$ Soild Solutions by Reactive Magnetron Sputtering" Mikrochim Acta 133, (2000) p. 191-196.*

Viktorov et al "Fine Structure of alpha-$Al_2O_3$- Based Solid Soultions" Inorganic Materials vol. 37, No. 10 (2001) p. 983-991, translated from Neoganucheskie Materialy, vol. 37, No. 10 (2001) p. 1159-1169.*

International Search Report, dated Jun. 15, 2009, from corresponding PCT application.

* cited by examiner

OXIDE COATED CUTTING INSERT

BACKGROUND OF THE INVENTION

1. Field of the Invention

The present invention relates to a tool for machining by chip removal comprising a body of a hard alloy of cemented carbide, cermet, ceramics, cubic boron nitride based material or high speed steel and a hard and wear resistant oxide designed to be used in machining of steel and stainless steel, preferably at high cutting speeds. The said coating is composed of one or more layers of which at least one layer is a textured physical vapour deposited (PVD) corundum phase alumina containing chromium $(Al,Cr)_2O_3$.

2. Description of the Related Art

Textured $\alpha$-$Al_2O_3$ layers, produced with chemical vapour deposition (CVD) are disclosed in, e.g., EP 603144, EP 1528125, EP 1477581, EP 1655387, EP 659903, EP 738336, EP 1655388, EP 1655392, US 2007/104945, US 2004/202877.

EP 1479791 discloses a cutting tool composed of cemented carbide or cermet, and a hard coating; wherein the hard coating includes an $\alpha$-$Al_2O_3$ layer formed by CVD, with the highest peak, measuring the inclination of the $\alpha$-$Al_2O_3$ basal planes relative to the normal of the surface within a range of 0-10 degrees as determined by electron back scattering diffraction (EBSD).

EP 744473 discloses textured $\gamma$-$Al_2O_3$ layers produced by PVD.

U.S. Pat. No. 5,310,607 discloses a hard coating including $(Al,Cr)_2O_3$ crystals and a chromium content higher than 5 at % wherein the $(Al,Cr)_2O_3$ is a single crystal. The coating is deposited at a temperature lower than 900 C. The hard coating is deposited by a CVD or PVD process.

When machining steel with an alumina coated cemented carbide tool, the cutting edge is worn according to different wear mechanisms, such as chemical wear, abrasive wear, adhesive wear and by edge chipping caused by cracks formed along the cutting edge. The domination of any of the wear mechanisms is determined by the application, and is dependent on properties of the machined material, applied cutting parameters and the properties of the tool material. In general, it is very difficult to improve all tool properties simultaneously, and commercial cemented carbide grades have usually been optimised with respect to one or few of the above mentioned wear types, and have consequently been optimised for specific application areas. This can, for instance, be achieved by controlling the texture of the alumina layer.

SUMMARY OF THE INVENTION

It is an object of the present invention to provide a wear resistant and hard oxide coated cutting tool with enhanced performance for machining of steel and stainless steel.

The cutting tool insert according to the present invention includes a body of a hard alloy of cemented carbide, cermet, ceramics, cubic boron nitride based material or high speed steel comprising a textured oxide layer of corundum phase $(Al,Cr)_2O_3$ with excellent metal machining properties.

DETAILED DESCRIPTION OF THE INVENTION

Figure 1A:
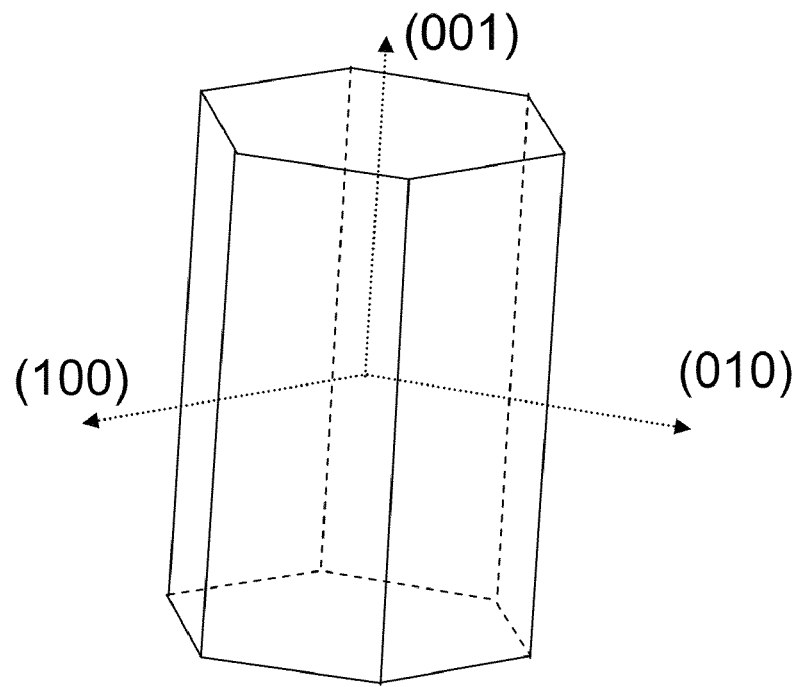
FIG. 1a shows a schematic view of the hexagonal crystal structure with the a-axis (100), b-axis (010) and c-axis (001) marked.
Figure 1B:
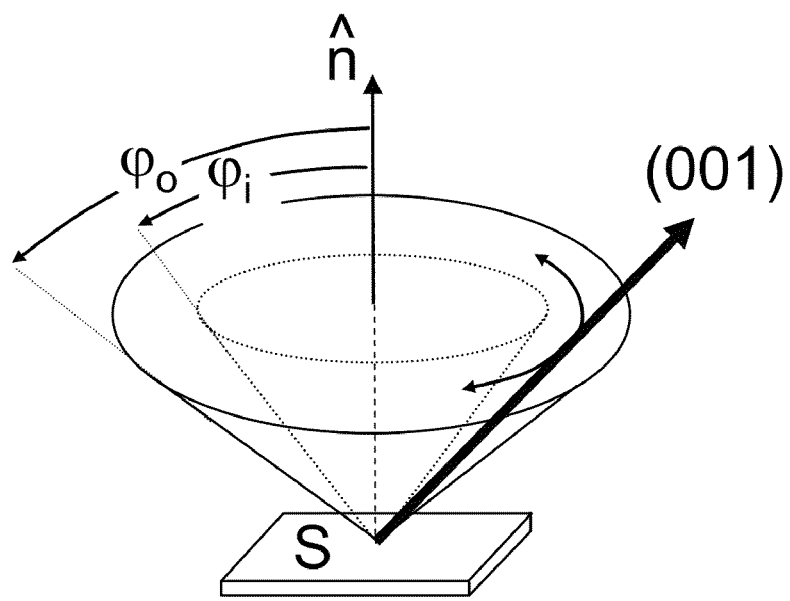
FIG. 1b shows a schematic view of the fibre texture with (S) coating surface, ($\phi$) the inclination angle of the c-axis (001) of the hexagonal structure (FIG. 1a) and the normal (n) to the coating surface.

According to the present invention, there is provided a cutting tool for machining by chip removal, particularly useful in metal cutting of steel and stainless steel, comprising a body of a hard alloy of cemented carbide, cermet, ceramics, cubic boron nitride based material or high speed steel onto which a coating is deposited comprising:

preferably a first (innermost) bonding layer (FIG. 3(B)) of, e.g., TiN or (Al,Cr)N preferably less than 0.5 µm according to prior art.

a layer of $(Al_{1-y}Cr_y)_2O_3$ with $0.5 \leq y \leq 0.7$, preferably y=0.6, with a thickness of 1-5 µm, preferably 1.5-4.5 µm, most preferably 2-4 µm, with textured columnar grains. The $(Al,Cr)_2O_3$ layer has a corundum structure formed by PVD and a fiber texture with rotational symmetry in the direction of the coated surface normal with an inclination angle, $\phi$, (FIG. 1b) of the basal planes relative to the coated surface normal (FIG. 5A) or the inclination angle, $\phi$, for the highest peak in the pole plot (FIG. 5B) with $20° < \phi < 55°$, preferably $30° < \phi < 45°$ as determined by, e.g., electron back scattering diffraction (EBSD) or x-ray diffraction (XRD).

Said (Al,Cr)O layer has a compressive stress level of $-4.5 < \sigma < -0.5$ GPa, preferably of $-3.0 < \sigma < -1.0$ GPa.

The composition, y, of $(Al_{1-y}Cr_y)_2O_3$ is determined by, e.g., EDS or WDS.

Said body may further be coated with an inner single- and/or multilayer coating of, e.g. TiN, TiC, Ti(C,N), (Al,Cr)N or (Ti,Al)N, preferably (Ti,Al)N, (Al,Cr)N, and/or an outer single- and/or multilayer coating of, e.g. TiN, TiC, (Ti,C)N or (Ti,Al)N, preferably (Ti,Al)N, (Al,Cr)N, to a total thickness 1 to 20 µm, preferably 1 to 10 µm and most preferably 2 to 7 µm according to prior art.

The deposition method for the layer of the present invention is based on cathodic arc evaporation of an alloy or composite cathode under the following conditions; $(Al,Cr)_2O_3$ layers are grown using Al+Cr-cathodes with a composition between (30 at % Al+70 at % Cr) and (60 at % Al+40 at % Cr) and preferably between (30 at % Al+70 at % Cr) and (50 at % Al+50 at % Cr). The evaporation current is between 50 A and 200 A depending on the cathode size and preferably between 60 A and 90 A using cathodes of 63 mm in diameter. The layers are grown in an Ar+$O_2$ atmosphere, preferably in a pure $O_2$ atmosphere at a total pressure of 2.0 Pa to 5.0 Pa, preferably 2.0 Pa to 4.0 Pa. The bias is −50 V to −200 V, preferably −75 V to −125V. The deposition temperature is between 500° C. and 700° C., preferably between 500° C. and 600° C.

The invention also relates to the use of cutting tool inserts according to the above for machining of steel and stainless steel at cutting speeds of 75-600 m/min, preferably 150-500 m/min, with an average feed, per tooth in the case of milling, of 0.08-0.5 mm, preferably 0.1-0.4 mm depending on cutting speed and insert geometry.

Example 1

Grade A: Cemented carbide inserts with the composition 10 wt % Co and balance WC, were used.

Figure 2:
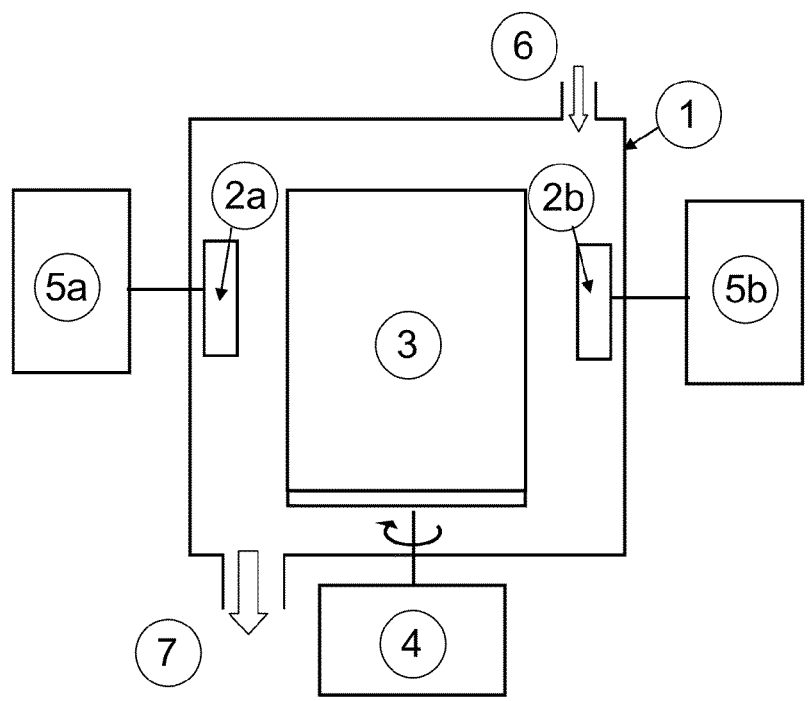
FIG. 2 shows a schematic side view of the deposition chamber showing (1) vacuum chamber, (2a) cathode material A, (2b) cathode material B, (3) fixture, (4) power supply for biasing, (5a) cathodic arc power supply (5b) cathodic arc power supply, (6) inlet for process gas and (7) outlet for vacuum pump.

Before deposition, the inserts were cleaned in ultrasonic baths of an alkali solution and alcohol. The system was evacuated to a pressure of less than $2.0 \times 10^{-3}$ Pa, after which the inserts were sputter cleaned with Ar ions. At first, a bonding layer of TiN with a thickness of 0.2 μm followed by a textured $(Al,Cr)_2O_3$ layer of thickness 2.5 μm, were grown by cathodic arc evaporation of an alloyed (40 at % Al+60 at % Cr) cathode, 63 mm in diameter (position (2a) and (2b) in FIG. 2a) in 99.995% pure $O_2$ atmosphere at a total pressure of 3.0 Pa and a deposition temperature of about 400° C. to a total coating thickness of 3 μm. The evaporation current was 75 A and the bias was held at −100 V during depositions. Finally, a top colour coating consisting of 0.3 μm (Al,Cr)N and 0.2 μm TiN was applied.

Figure 3:
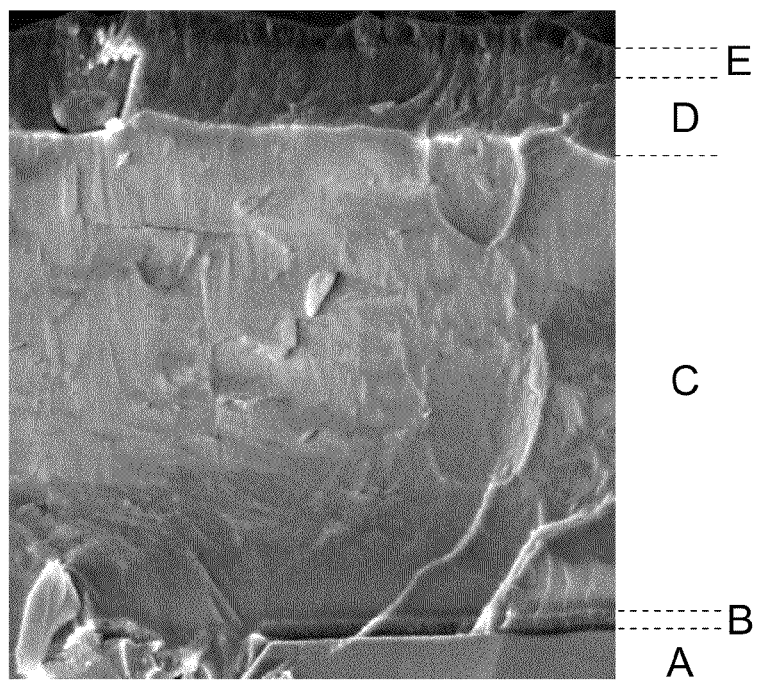
FIG. 3 shows a scanning electron micrograph in secondary mode of a fractured cross section of a coating according to the invention. (A) body, (B) bonding layer, (C) (Al,Cr)O layer, (D) (Al,Cr)N layer and (E) TiN layer.

A fractured cross-section SEM micrograph of the coating is shown in FIG. 3 with (A) body, (B) bonding layer, (C) (Al,Cr)O layer, (D) (Al,Cr)N layer and (E) TiN layer.

Figure 4:
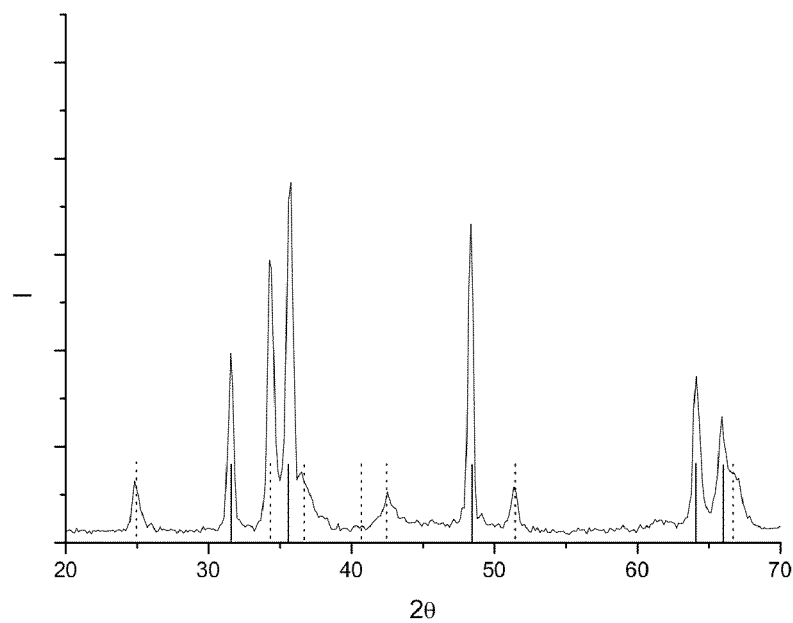
FIG. 4 shows an x-ray diffraction pattern of a textured $(Al,Cr)_2O_3$ layer. The peaks of cemented carbide are marked with solid lines whereas the peaks originating from $(Al,Cr)_2O_3$ with dashed lines.

The XRD patterns of the as-deposited layers were obtained using CuKα-radiation and a θ-2θ configuration. FIG. 4 shows the XRD pattern of a coating according to the invention with a textured corundum phase alumina $(Al,Cr)_2O_3$ layer. The peaks originating from the $(Al,Cr)_2O_3$ layer are marked with dashed lines whereas the of cemented carbide are marked with solid lines.

Figure 5:
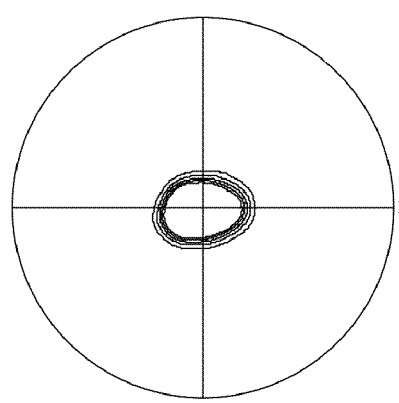
FIG. 5 shows (A) (001) pole figure and (B) (001) pole plot graph of a $(Al,Cr)_2O_3$ layer according to the invention.
Figure 5:
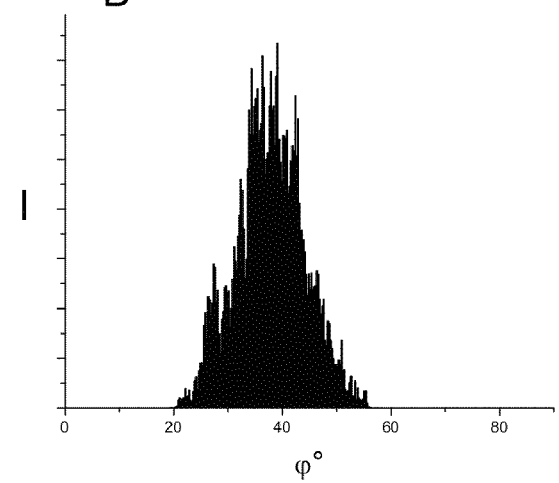

The EBSD pole figure (FIG. 5(A)) and pole plot graph (FIG. 5(B)) of the as-deposited corundum phase $(Al,Cr)_2O_3$ layers in the c-axis (001) direction (FIG. 1a), respectively, showing a fiber texture (rotational symmetry) in the direction of the coated surface normal (FIG. 1b) with an inclination angle, φ (FIG. 1b), of the basal planes relative to the coated surface normal between 20 and 55°. The highest peak in the pole plot is at about 38°. The EBSD data were obtained using a LEO Ultra 55 scanning electron microscope operated at 20 kV equipped with a HKL Nordlys II EBSD detector and evaluated with the Channel 5 software.

The residual stress, σ, of the $(Al,Cr)_2O_3$ layer was evaluated by XRD measurements using the $sin^2\psi$ method. The measurements were performed using CrKα-radiation on the $(Al,Cr)_2O_3$ (116)-reflection. The residual stress value was 2.2±0.4 GPa as evaluated using a Possion's ratio of v=0.26 and Young's modulus of E=420 GPa.

The composition, y=0.58, of $(Al_{1-y}Cr_y)_2O_3$ was estimated by energy dispersive spectroscopy (EDS) analysis using a LEO Ultra 55 scanning electron microscope with a Thermo Noran EDS detector operating at 10 kV. The data were evaluated using a Noran System Six (NSS ver 2) software.

Example 2

Grade B: A layer of 3.0 μm $Ti_{0.34}Al_{0.66}N$ was deposited by PVD on cemented carbide inserts with the composition 10 wt % Co and balance WC, according to prior art.

Example 3

Grade C: A coating consisting of 3.0 μm Ti(C,N)+3.0 μm α-$Al_2O_3$ was deposited by CVD on cemented carbide inserts with the composition 10 wt % Co and balance WC, according to prior art.

Example 4

Grade D: Example 1 was repeated using cemented carbide inserts with the composition 5 wt % Co and balance WC.

Example 5

Grade E: A layer of 3.0 μm $Ti_{0.34}Al_{0.66}N$ was deposited by PVD on cemented carbide inserts with the composition 5 wt % Co and balance WC, according to prior art.

Example 6

Grade F: A coating consisting of 3.0 μm Ti(C,N)+3.0 μm α-$Al_2O_3$ was deposited by CVD on cemented carbide inserts with the composition 5 wt % Co and balance WC, according to prior art.

Example 7

Grades A, B and C were tested in machining in steel.

| Operation | Face milling |
| --- | --- |
| Cutter diameter | 125 mm |
| Material | SS1672 |
| Insert type | SEEX1204AFTN-M15 |
| Cutting speed | 300 m/min |
| Feed | 0.2 mm/tooth |
| Depth of cut | 2.5 mm |
| Width of cut | 120 mm |
| Results | Tool life (min) |
| Grade A (grade according to invention) | 6.4 |
| Grade B | 5.6 |
| Grade C | 3.2 |

The test was stopped at the same maximum flank wear. The wear resistance was much improved with the grade according to the invention.

Example 8

Grades A, B and C were tested in machining in stainless steel.

| Operation | Shoulder milling |
| --- | --- |
| Cutter diameter | 32 mm |
| Material | SS1672 |
| Insert type | XOEX120408-M07 |
| Cutting speed | 275 m/min |
| Feed | 0.25 mm/tooth |
| Depth of cut | 3 mm |
| Width of cut | 8.8 mm |
| Results | Tool life (min) |
| Grade A (grade according to invention) | 5.8 |
| Grade B | 3.9 |
| Grade C | 1.5 |

The test was stopped at the same maximum flank wear. The wear resistance was much improved with the grade according to the invention.

Example 9

Grades D, E and F were tested in machining in stainless steel.

| Operation | Interrupted turning |
|---|---|
| Material | SS2348 |
| Insert type | CNMG120408-MR3 |
| Cutting speed | 80 m/min |
| Feed | 0.3 mm |
| Depth of cut | 2 mm |
| Results | Tool life (cycles) |
| Grade D (grade according to invention) | 6 |
| Grade E | 3 |
| Grade F | 4 |

The test was stopped at the same maximum flank wear. The wear resistance was much improved with the grade according to the invention.

Example 10

Grades D, E and F were tested in machining in steel.

| Operation | Interrupted turning |
|---|---|
| Material | SS1672 |
| Insert type | CNMG120408-MR3 |
| Cutting speed | 350 m/min |
| Feed | 0.3 mm |
| Depth of cut | 2 mm |
| Results | Tool life (min) |
| Grade D (grade according to invention) | 10.7 |
| Grade E | 3.8 |
| Grade F | 9.2 |

The test was stopped at the same maximum flank wear. The wear resistance was much improved with the grade according to the invention.

The invention claimed is:

1. A cutting tool insert comprising:
a body of a hard alloy of cemented carbide, cermet, ceramics, cubic boron nitride based material or high speed steel; and
a hard and wear resistant coating applied to the body, the coating comprising one or several layers, at least one of which is an $(Al,Cr)_2O_3$ layer, wherein
said layer has a corundum phase crystalline structure and a composition $(Al_{1-y}Cr_y)_2O_3$ with $0.5 \leq y \leq 0.7$, with a thickness of 0.5 to 10 μm and a fiber texture, rotational symmetry, in a direction of a coated surface normal with an inclination angle, $\phi$, of basal planes relative to the coated surface normal is $20°<\phi<55°$ or the inclination angle, $\phi$, for a highest peak in a pole plot is $20°<\phi<55°$.

2. The cutting tool insert according to claim 1, wherein said inclination angle, $\phi$, of the basal planes relative to the coated surface normal is between $30°<\phi<45°$.

3. The cutting tool insert according to claim 1, wherein said layer has a residual stress of $-4.5<\phi<-0.5$ GPa.

4. The cutting tool insert according to claim 1, wherein said layer has been deposited with PVD.

5. The cutting tool insert according to claim 1, wherein said body is coated with an inner single- and/or multilayer coating of, TiN, TiC, Ti(C,N), (Al,Cr)N or (Ti,Al)N, and/or an outer single- and/or multilayer coating of, TiN, TiC, Ti(C,N), (Al,Cr)N or (Ti,Al)N, to a total coating thickness of 1 to 20 μm.

6. The cutting tool insert according to claim 1, where the $(Al,Cr)_2O_3$ layer was deposited by cathodic arc evaporation using Al+Cr-cathodes with a composition between (30 at % Al+70 at % Cr) and (60 at % Al+40 at % Cr), an evaporation current between 50 A and 200 A depending on the cathode size in an $Ar+O_2$ atmosphere, at a total pressure of 2.0 Pa to 5.0 Pa, a bias of −50 V to −200 V, and a deposition temperature of between 500° C. and 700° C.

7. A method of cutting with the cutting tool insert according to claim 1, comprising:
machining steel or stainless steel at cutting speeds of 75-600 m/min, with an average feed, per tooth when milling, of 0.08-0.5 mm, depending on cutting speed and insert geometry.

8. The cutting tool insert according to claim 1, wherein y=0.6.

9. The cutting tool insert according to claim 1, wherein the thickness is 1-5 μm.

10. The cutting tool insert according to claim 1, wherein said layer has a residual stress of $-3.0<\phi<-1.0$ GPa.

11. The cutting tool insert according to claim 1, wherein said layer was deposited with cathodic arc evaporation.

12. The cutting tool insert according to claim 1, wherein said body is coated with an inner single- and/or multilayer coating of (Ti,Al)N or (Al,Cr)N, and/or an outer single- and/or multilayer coating of, (Ti,Al)N or, (Al,Cr)N, to a total coating thickness of 1 to 10 μm.

13. The cutting tool insert according to claim 1, wherein the $(Al,Cr)_2O_3$ layer was deposited by cathodic arc evaporation using Al+Cr-cathodes with a composition between (30 at % Al+70 at % Cr) and (50 at % Al+50 at % Cr), an evaporation current between 50 A and 200 A depending on the cathode size in a pure $O_2$ atmosphere at a total pressure of 2.0 Pa to 4.0 Pa, a bias of −75 V to −125 V, and a deposition temperature of between 500° C. and 600° C.

14. The method according to claim 7, wherein the feed per tooth is 0.1-0.4 mm.

* * * * *

UNITED STATES PATENT AND TRADEMARK OFFICE
CERTIFICATE OF CORRECTION

PATENT NO. : 8,409,732 B2  Page 1 of 1
APPLICATION NO. : 12/921215
DATED : April 2, 2013
INVENTOR(S) : Johansson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 318 days.

Signed and Sealed this
First Day of September, 2015

Michelle K. Lee
*Director of the United States Patent and Trademark Office*